(12) United States Patent
Happ et al.

(10) Patent No.: US 8,208,294 B2
(45) Date of Patent: Jun. 26, 2012

(54) RESISTIVE MEMORY CELL ACCESSED USING TWO BIT LINES

(75) Inventors: Thomas Happ, Munich (DE); Jan Boris Philipp, Munich (DE)

(73) Assignee: Qimonda AG, Munich (DE)

( * ) Notice: Subject to any disclaimer, the term of this patent is extended or adjusted under 35 U.S.C. 154(b) by 256 days.

(21) Appl. No.: 12/692,044

(22) Filed: Jan. 22, 2010

(65) Prior Publication Data

US 2010/0290277 A1    Nov. 18, 2010

(30) Foreign Application Priority Data

Jan. 23, 2009 (EP) .................................. 09000936

(51) Int. Cl.
*G11C 11/00* (2006.01)
(52) U.S. Cl. ........................... 365/163; 365/46; 365/148
(58) Field of Classification Search ................... 365/46, 365/113; 438/382
See application file for complete search history.

(56) References Cited

U.S. PATENT DOCUMENTS

| | | | |
|---|---|---|---|
| 7,064,970 B2 * | 6/2006 | Nazarian ........................ | 365/46 |
| 7,221,579 B2 | 5/2007 | Krusin-Elbaum et al. | |
| 7,394,089 B2 | 7/2008 | Doyle et al. | |
| 7,411,818 B1 | 8/2008 | Elmegreen et al. | |
| 7,570,507 B2 * | 8/2009 | Nirschl ......................... | 365/148 |
| 2008/0061282 A1 | 3/2008 | Sato et al. | |
| 2008/0067490 A1 | 3/2008 | Hayakawa | |
| 2008/0090324 A1 | 4/2008 | Lee et al. | |
| 2008/0116445 A1 | 5/2008 | Chang | |

OTHER PUBLICATIONS

Lai et al., "OUM—A 180 nm Nonvolatile Memory Cell Element Technology for Stand Alone and Embedded Applications," IEDM 2001, Santa Clara, CA, 2 pages.

Gill et al., "Ovonic Unified Memory—A High-performance Non-volatile Memory Technology for Stand Alone Memory and Embedded Applications," GST ISSCC 2002, Santa Clara, CA, pp. 1-4.

Ahn et al., "Highly Reliable 50nm Contact Cell Technology for 256Mb PRAM," VLSI 2005, 2 pages.

* cited by examiner

*Primary Examiner* — Tan T. Nguyen
(74) *Attorney, Agent, or Firm* — Dicke, Billig & Czaja, PLLC (57) ABSTRACT

An integrated circuit includes a first bit line and a resistance changing memory element coupled to the first bit line. The integrated circuit includes a second bit line and a heater coupled to the second bit line. The integrated circuit includes an access device coupled to the resistance changing memory element and the heater.

25 Claims, 11 Drawing Sheets

Fig. 19B

RESISTIVE MEMORY CELL ACCESSED USING TWO BIT LINES

CROSS-REFERENCE TO RELATED APPLICATIONS

This Utility Patent Application claims priority to European Patent Application No. 09000936.6-1233, filed on Jan. 23, 2009, and incorporated herein by reference.

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state—"set"—and from the crystalline state to the amorphous state—"reset"—in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change memory cell. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

For these and other reasons, there is a need for the present invention.

SUMMARY

One embodiment provides an integrated circuit. The integrated circuit includes a first bit line and a resistance changing memory element coupled to the first bit line. The integrated circuit includes a second bit line and a heater coupled to the second bit line. The integrated circuit includes an access device coupled to the resistance changing memory element and the heater.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
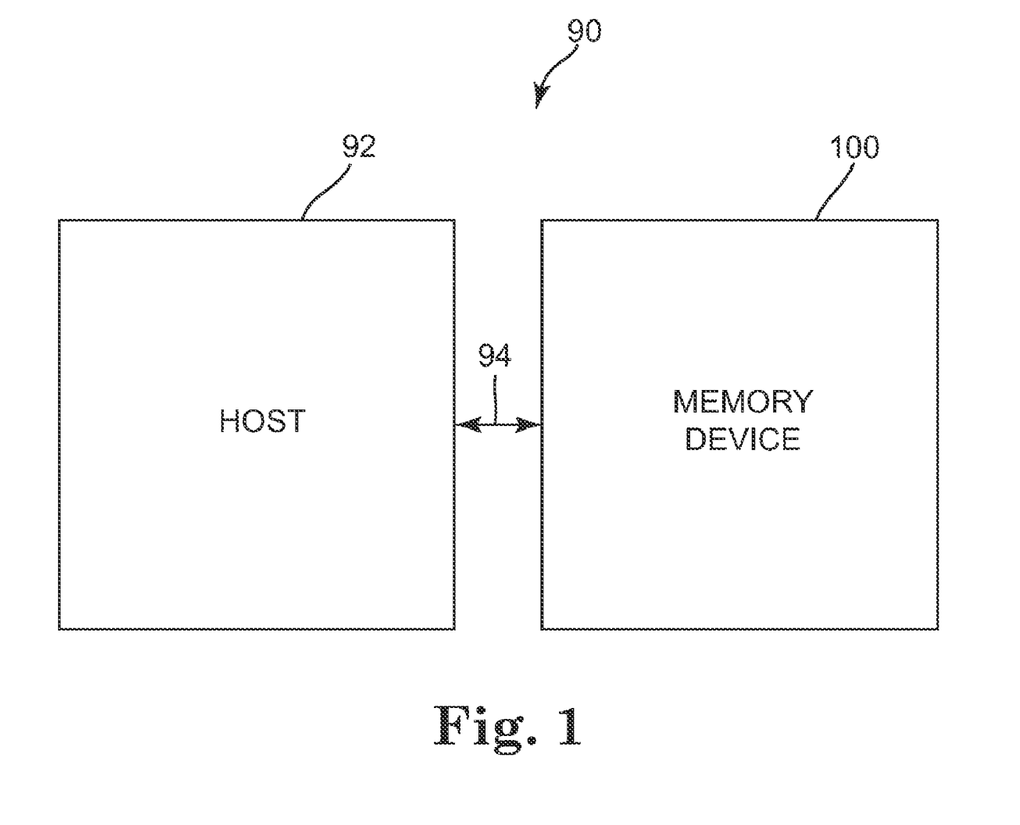
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a microprocessor, computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or another suitable resistive or resistivity changing material memory device.

Figure 2:
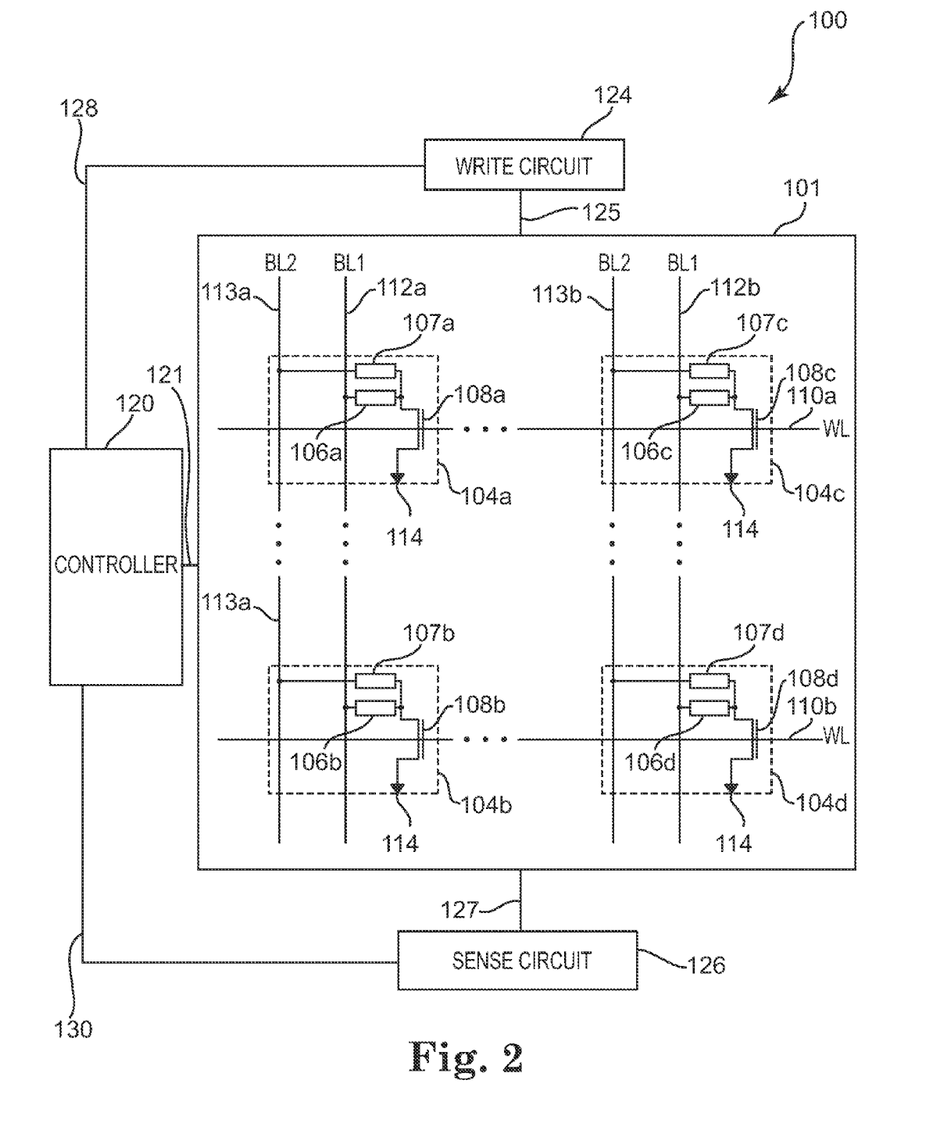
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes a write circuit 124, a controller 120, a memory array 101, and a sense circuit 126. Memory array 101 includes a plurality of resistive memory cells 104a-104d (collectively referred to as resistive memory cells 104), a plurality of first bit lines (BL1s) 112a-112b (collectively referred to as first bit lines 112), a plurality of second bit lines (BL2s) 113a-113b (collectively referred to as second bit lines 113), and a plurality of word lines (WLs) 110a-110b (collectively referred to as word lines 110). In one embodiment, resistive memory cells 104 are phase change memory cells.

In one embodiment, each memory cell 104 includes a phase change element and a heater. The heater is thermally coupled to the phase change element for programming the phase change element. A first bit line is electrically coupled to each phase change element for reading the state of each phase change element. A second bit line is electrically coupled to each heater for writing a desired state to each phase change element.

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a first bit line 112, a second bit line 113, and a common or ground 114. Phase change memory cell 104a is electrically coupled to first bit line 112a, second bit line 113a, word line 110a, and common or ground 114. Phase change memory cell 104b is electrically coupled to first bit line 112a, second bit line 113a, word line 110b, and common or ground 114. Phase change memory cell 104c is electrically coupled to first bit line 112b, second bit line 113b, word line 110a, and common or ground 114. Phase change memory cell 104d is electrically coupled to first bit line 112b, second bit line 113b, word line 110b, and common or ground 114.

Each phase change memory cell 104 includes a phase change element 106, a heater 107, and a transistor 108. While transistor 108 is a field-effect transistor (FET) in the illustrated embodiment, in other embodiments, transistor 108 can be another suitable access device such as a bipolar transistor, a thyristor, or a 3D transistor structure. In other embodiments, a diode or diode-like structure is used in place of transistor 108. In this case, a diode and phase change element 106 is coupled in series between each cross point of word lines 110 and first bit lines 112, and the diode and heater 107 are coupled in series between each cross point of word lines 110 and second bit lines 113.

Phase change memory cell 104a includes phase change element 106a, heater 107a, and transistor 108a. One side of phase change element 106a is electrically coupled to first bit line 112a. The other side of phase change element 106a is electrically coupled to one side of the source-drain path of transistor 108a and one side of heater 107a. The other side of the source-drain path of transistor 108a is electrically coupled to common or ground 114. The gate of transistor 108a is electrically coupled to word line 110a. The other side of heater 107a is electrically coupled to second bit line 113a.

Phase change memory cell 104b includes phase change element 106b, heater 107b, and transistor 108b. One side of phase change element 106b is electrically coupled to first bit line 112a. The other side of phase change element 106b is electrically coupled to one side of the source-drain path of transistor 108b and one side of heater 107b. The other side of the source-drain path of transistor 108b is electrically coupled to common or ground 114. The gate of transistor 108b is electrically coupled to word line 110b. The other side of heater 107b is electrically coupled to second bit line 113a.

Phase change memory cell 104c includes phase change element 106c, heater 107c, and transistor 108c. One side of phase change element 106c is electrically coupled to first bit line 112b. The other side of phase change element 106c is electrically coupled to one side of the source-drain path of transistor 108c and one side of heater 107c. The other side of the source-drain path of transistor 108c is electrically coupled to common or ground 114. The gate of transistor 108c is electrically coupled to word line 110a. The other side of heater 107c is electrically coupled to second bit line 113b.

Phase change memory cell 104d includes phase change element 106d, heater 107d, and transistor 108d. One side of phase change element 106d is electrically coupled to first bit line 112b. The other side of phase change element 106d is electrically coupled to one side of the source-drain path of transistor 108d and one side of heater 107d. The other side of the source-drain path of transistor 108d is electrically coupled to common or ground 114. The gate of transistor 108d is electrically coupled to word line 110b. The other side of heater 107d is electrically coupled to second bit line 113b.

In one embodiment, each phase change element 106 includes a phase change material that may be made up of a variety of materials. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Bi, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100. In the amorphous state, a phase change material exhibits significantly higher resistivity than in the crystalline state. Therefore, the two or more states of phase change elements 106a-106d differ in their electrical resistivity.

In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Each heater 107 includes a resistive material for generating heat in response to a current or voltage applied to the heater. In one embodiment, each heater 107 includes TiN, TaN, Ti, Ta, TiSiN, TaSiN, TiAlN, TaAlN, WN, or other suitable material. Each heater 107 is thermally coupled to a phase change element 106. Each heater 107 provides the heat for programming the phase change element to an amorphous state, to a crystalline state, or to a partially amorphous and partially crystalline state.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, write circuit 124 provides voltage pulses through signal path 125 and second bit lines 113 to heaters 107 to program phase change elements 106. In other embodiments, write circuit 124 provides current pulses through signal path 125 and second bit lines 113 to heaters 107 to program phase change elements 106.

Sense circuit 126 reads each of the two or more states of memory cells 104 through first bit lines 112 and signal path 127. In one embodiment, to read the resistance of one of the memory cells 104, sense circuit 126 provides current that flows through one of the phase change elements 106. Sense circuit 126 then reads the voltage across that one of the phase change elements 106. In another embodiment, sense circuit 126 provides voltage across one of the phase change elements 106 and reads the current that flows through that one of the phase change elements 106.

During a reset operation of phase change memory cell 104a, word line 110a is selected to activate transistor 108a. With word line 110a selected, a reset current or voltage pulse is selectively enabled by write circuit 124 and sent through second bit line 113a to heater 107a. The reset current or voltage quickly heats heater 107a, which quickly heats phase change element 106a above its melting temperature. After the current or voltage pulse is turned off, phase change element 106a quickly quench cools into the amorphous state or a partially amorphous and partially crystalline state.

During a set operation of phase change memory cell 104a, word line 110a is selected to activate transistor 108a. With word line 110a selected, one or more set current or voltage pulses are selectively enabled by write circuit 124 and sent through second bit line 113a to heater 107a. The set current or voltage pulses heats heater 107a, which heats phase change element 106a above its crystallization temperature (but usually below its melting temperature). In this way, phase change element 106a reaches the crystalline state or a partially crystalline and partially amorphous state during this set operation.

During a read operation of phase change memory cell 104a, word line 110a is selected to activate transistor 108a. In one embodiment with word line 110a selected, a read current is applied to phase change element 106a by sense circuit 126 through first bit line 112a. Sense circuit 126 then reads the voltage across phase change element 106a to sense the state of phase change element 106a. In another embodiment with word line 110a selected, a read voltage is applied to phase change element 106a by sense circuit 126 through first bit line 112a. Sense circuit 126 then reads the current through phase change element 106a to sense the state of phase change element 106a. Phase change memory cells 104b-104d and other phase change memory cells 104 in memory array 101 are set, reset, and read similarly to phase change memory cell 104a using similar current or voltage pulses.

Figure 3A:
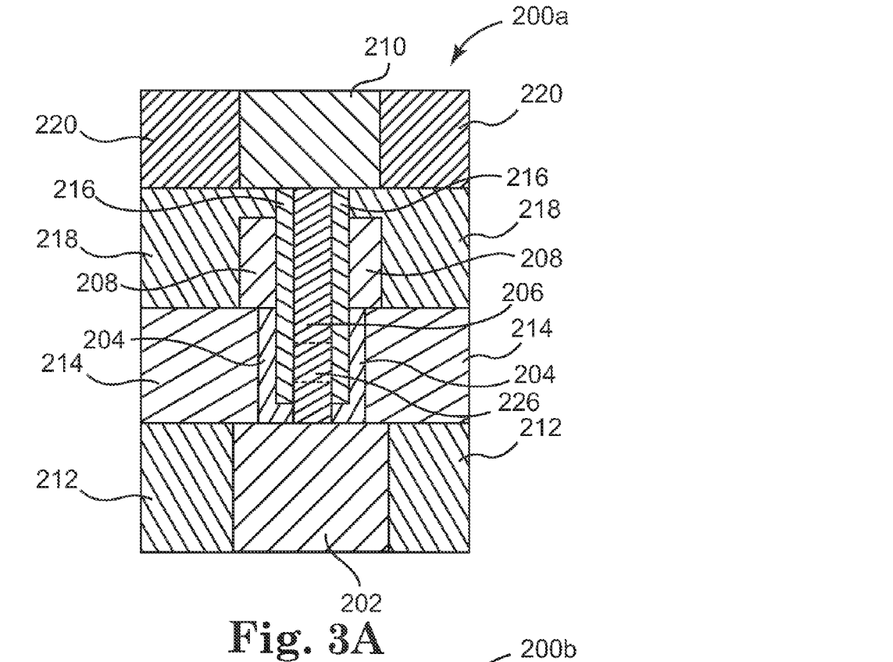
FIG. 3A illustrates a cross-sectional view of one embodiment of a memory cell.

FIG. 3A illustrates a cross-sectional view of one embodiment of a memory cell 200a. In one embodiment, memory cell 200a provides each memory cell 104 previously described and illustrated with reference to FIG. 2. Memory cell 200a includes an electrode 202, a heater 204, a phase change element 206, a first bit line 208, a second bit line 210, and dielectric material 212, 214, 216, 218, and 220.

Electrode 202 includes TiN, TaN, W, Al, Ti, Ta, TiSiN, TaSiN, TiAlN, TaAlN, WN, Cu, C, or other suitable electrode material. The top of electrode 202 contacts the bottom of heater 204 and the bottom of phase change element 206. In one embodiment, heater 204 is pipe-shaped and phase change element 206 is cylindrical-shaped. In other embodiments, heater 204 and phase change element 206 have other suitable configurations. Heater 204 includes TiN, TaN, Ti, Ta, TiSiN, TaSiN, TiAlN, TaAlN, WN, or other suitable heater material. Phase change element 206 includes a chalcogenide compound material or another suitable resistance changing material. The top of heater 204 contacts the bottom of first bit line 208. First bit line 208 includes W, Cu, Al, or other suitable bit line material. The top of phase change element 206 contacts the bottom of second bit line 210. Second bit line 210 includes W, Cu, Al, or other suitable bit line material.

Dielectric material 216 includes SiN, Al$_2$O$_3$, or other suitable dielectric material. Dielectric material 216 laterally surrounds phase change element 206 and contacts the sidewalls of first bit line 208 and heater 204. Dielectric material 212, 214, 218, and 220 includes SiO$_2$, SiO$_x$, SiN, SiON, AlO$_x$, fluorosilicate glass (FSG), borophosphosilicate glass (BPSG), borosilicate glass (BSG), SiCN, SiCOH, or another suitable dielectric material. Dielectric material 212 laterally surrounds electrode 202. Dielectric material 214 laterally surrounds heater 204. Dielectric material 218 laterally surrounds second bit line 208 and a portion of dielectric material 216. Dielectric material 220 laterally surrounds second bit line 210.

Phase change element 206 provides a storage location for storing one or more bits of data. The active or phase change region indicated at 226 of phase change element 206 is at or near the center of heater 204. During operation of memory cell 200a, current or voltage pulses are applied between electrode 202 and first bit line 208 to heat heater 204 to program phase change element 206. During a set operation of memory cell 200a, one or more set current or voltage pulses are selectively enabled by write circuit 124 and sent to first bit line 208. From first bit line 208, the one or more set current or voltage pulses pass through heater 204 thereby heating heater 204. The heat from heater 204 heats the phase change material of phase change element 206 above its crystallization temperature (but usually below its melting temperature). In this way, the phase change material reaches a crystalline state or a partially crystalline and partially amorphous state during the set operation.

During a reset operation of memory cell 200a, a reset current or voltage pulse is selectively enabled by write circuit 124 and sent to first bit line 208. From first bit line 208, the reset current or voltage pulse passes through heater 204 thereby heating heater 204. The heat from heater 204 quickly heats the phase change material of phase change element 206 above its melting temperature. After the current or voltage pulse is turned off, the phase change material quickly quench cools into an amorphous state or a partially amorphous and partially crystalline state.

Figure 3B:
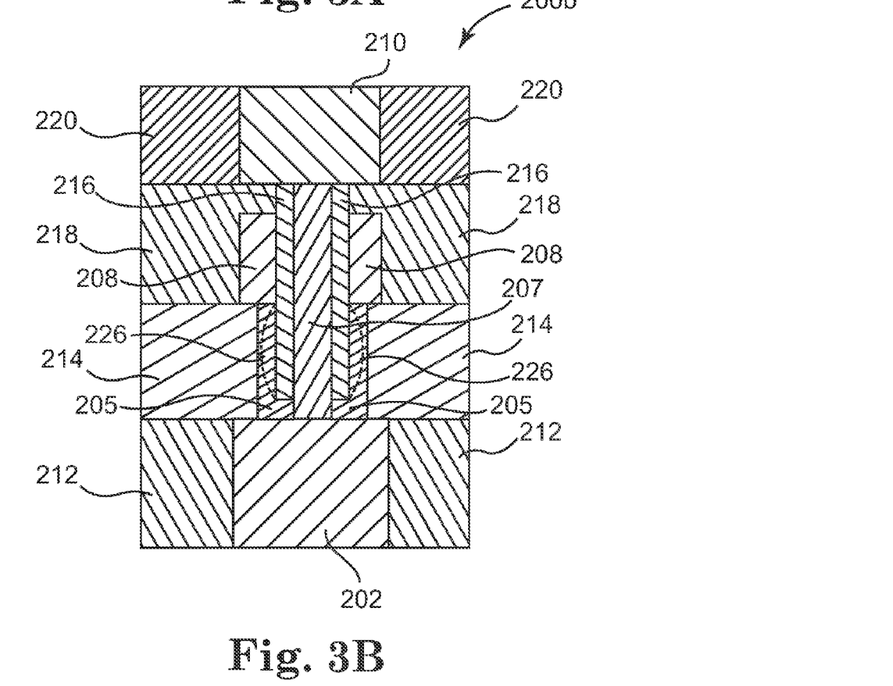
FIG. 3B illustrates a cross-sectional view of another embodiment of a memory cell.

FIG. 3B illustrates a cross-sectional view of another embodiment of a memory cell 200b. In one embodiment, memory cell 200b provides each memory cell 104 previously described and illustrated with reference to FIG. 2. Memory cell 200b is similar to memory cell 200a previously described and illustrated with reference to FIG. 3A, except that the location of the heater and the phase change element are reversed. Memory cell 200b includes phase change element 205 and heater 207.

The top of electrode 202 contacts the bottom of phase change element 205 and the bottom of heater 207. In one embodiment, phase change element 205 is pipe-shaped and heater 207 is cylindrical-shaped. In other embodiments, phase change element 205 and heater 207 have other suitable configurations. The top of phase change element 205 contacts the bottom of first bit line 208. The top of heater 207 contacts the bottom of second bit line 210. Dielectric material 216 laterally surrounds heater 207 and contacts the sidewalls of first bit line 208 and phase change element 205. Dielectric material 214 laterally surrounds phase change element 205.

Phase change element 205 provides a storage location for storing one or more bits of data. The active or phase change region of phase change element 205 is indicated at 226. During operation of memory cell 200b, current or voltage pulses are applied between electrode 202 and second bit line 210 to heat heater 207 to program phase change element 205. During a set operation of memory cell 200b, one or more set current or voltage pulses are selectively enabled by write circuit 124 and sent to second bit line 210. From second bit line 210, the one or more set current or voltage pulses pass through heater 207 thereby heating heater 207. The heat from heater 207 heats the phase change material of phase change element 205 above its crystallization temperature (but usually below its melting temperature). In this way, the phase change material reaches a crystalline state or a partially crystalline and partially amorphous state during the set operation.

During a reset operation of memory cell 200b, a reset current or voltage pulse is selectively enabled by write circuit 124 and sent to second bit line 210. From second bit line 210, the reset current or voltage pulse passes through heater 207 thereby heating heater 207. The heat from heater 207 quickly heats the phase change material of phase change element 205 above its melting temperature. After the current or voltage pulse is turned off, the phase change material quickly quench cools into an amorphous state or a partially amorphous and partially crystalline state.

Figure 3C:
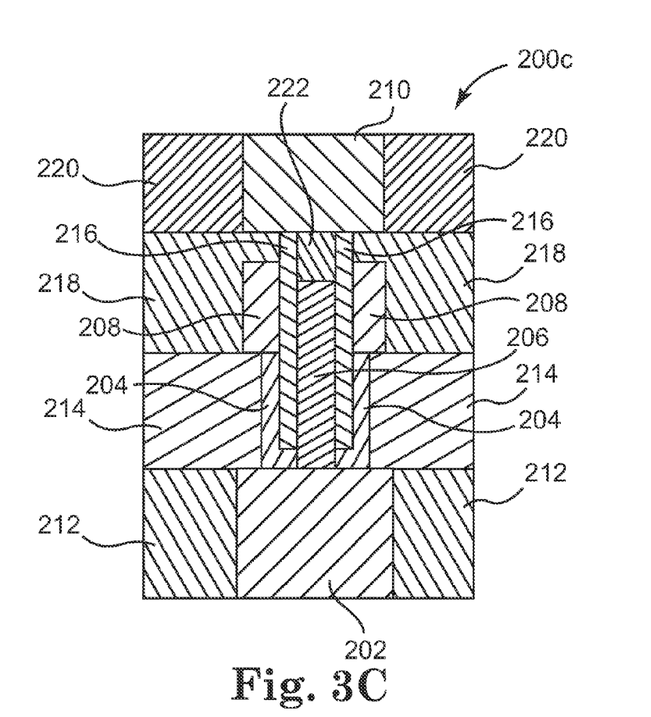
FIG. 3C illustrates a cross-sectional view of another embodiment of a memory cell.

FIG. 3C illustrates a cross-sectional view of another embodiment of a memory cell 200c. In one embodiment, memory cell 200c provides each memory cell 104 previously described and illustrated with reference to FIG. 2. Memory cell 200c is similar to memory cell 200a previously described and illustrated with reference to FIG. 3A, except that memory cell 200c includes a capping material 222. Capping material 222 caps phase change element 206. Capping material 222 includes TiN, TaN, W, Al, Ti, Ta, TiSiN, TaSiN, TiAlN, TaAlN, WN, Cu, C, or other suitable electrically conductive material. The bottom of capping material 222 contacts the top of phase change element 206. The top of capping material 222 contacts the bottom of second bit line 210. Capping material 222 is laterally surrounded by dielectric material 216. Memory cell 200c operates similarly to memory cell 200a.

Figure 3D:
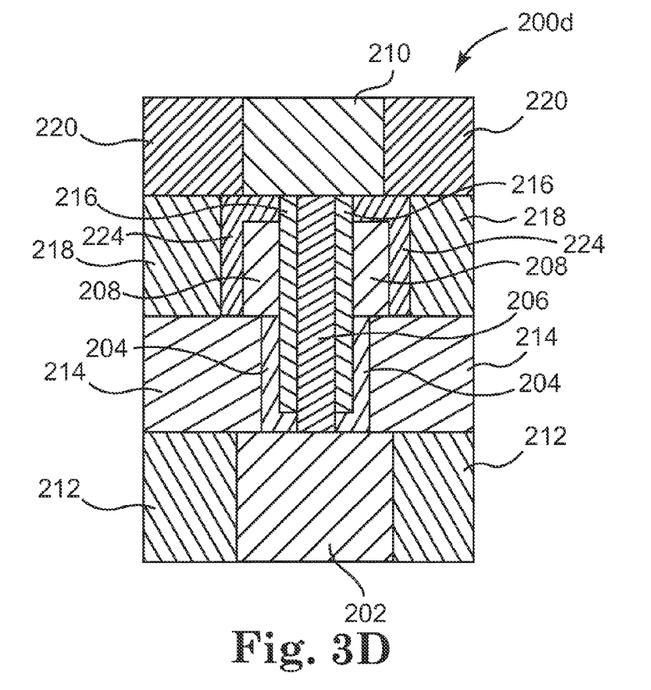
FIG. 3D illustrates a cross-sectional view of another embodiment of a memory cell.

FIG. 3D illustrates a cross-sectional view of another embodiment of a memory cell 200d. In one embodiment, memory cell 200d provides each memory cell 104 previously described and illustrated with reference to FIG. 2. Memory cell 200d is similar to memory cell 200a previously described and illustrated with reference to FIG. 3A, except that memory cell 200d includes an encapsulation material 224. Encapsulation material 224 encapsulates first bit line 208. Encapsulation material 224 includes SiN or another suitable dielectric material. Encapsulation material 224 laterally surrounds first bit line 208 and a portion of dielectric material 216. Encapsulation material 224 is laterally surrounded by dielectric material 218. Memory cell 200d operates similarly to memory cell 200a.

The following FIGS. 4-19B illustrate embodiments of a method for fabricating an array of memory cells, such as memory cells 200a-200d previously described and illustrated with reference to FIGS. 3A-3D, respectively. For simplicity, the following description will reference a single memory cell.

Figure 4:
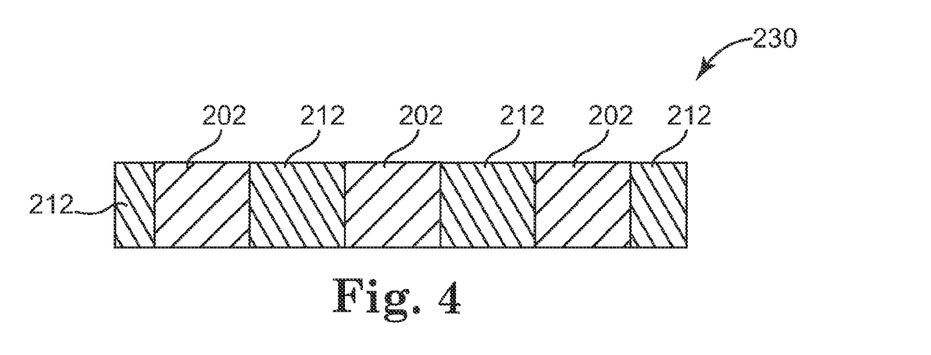
FIG. 4 illustrates a cross-sectional view of one embodiment of a preprocessed wafer.

FIG. 4 illustrates a cross-sectional view of one embodiment of a preprocessed wafer 230. Preprocessed wafer 230 includes an electrode 202 electrically coupled to a selection device (not shown), such as a transistor 108, a diode, or another suitable selection device, and dielectric material 212. Dielectric material 212 includes $SiO_2$, $SiO_x$, SiN, SiON, $AlO_x$, FSG, BPSG, BSG, SiCN, SiCOH, or other suitable dielectric material. Dielectric material 212 laterally surrounds electrode 202. Electrode 202 includes W, Cu, Al, or other suitable electrode material. In one embodiment, electrode 202 is substantially cylindrical-shaped or substantially square-shaped.

Figure 5A:
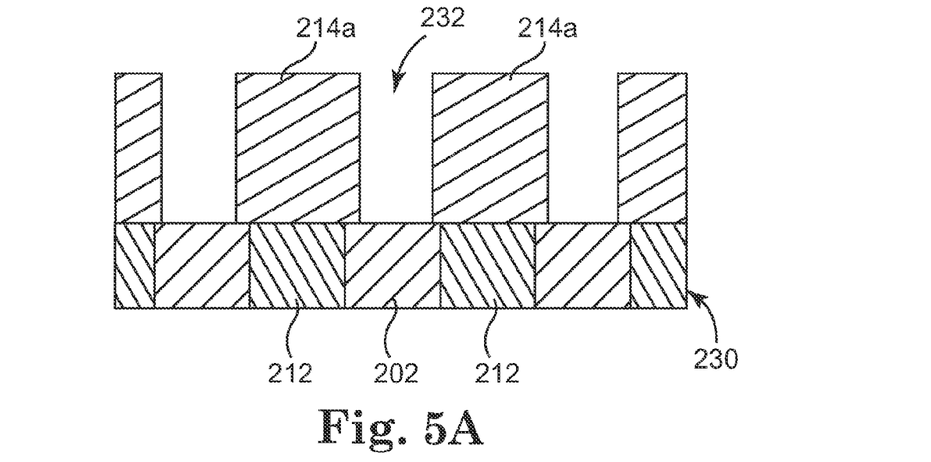
FIG. 5A illustrates a cross-sectional view of one embodiment of the preprocessed wafer and a first dielectric material.

FIG. 5A illustrates a cross-sectional view of one embodiment of preprocessed wafer 230 and a first dielectric material 214a. A dielectric material, such as $SiO_2$, $SiO_x$, SiN, SiON, $AlO_x$, FSG, BPSG, BSG, SiCN, SiCOH, or other suitable dielectric material is deposited over preprocessed wafer 230 to provide a dielectric material layer. The dielectric material layer is deposited using chemical vapor deposition (CVD), high density plasma-chemical vapor deposition (HDP-CVD), atomic layer deposition (ALD), metal organic chemical vapor deposition (MOCVD), plasma vapor deposition (PVD), jet vapor deposition (JVD), spin-on, or other suitable deposition technique. Portions of the dielectric material layer are then etched to provide opening 232 exposing at least a portion of electrode 202 and to provide first dielectric material 214a. In one embodiment, lithography using a double patterning technique is used to define opening 232.

Figure 5B:
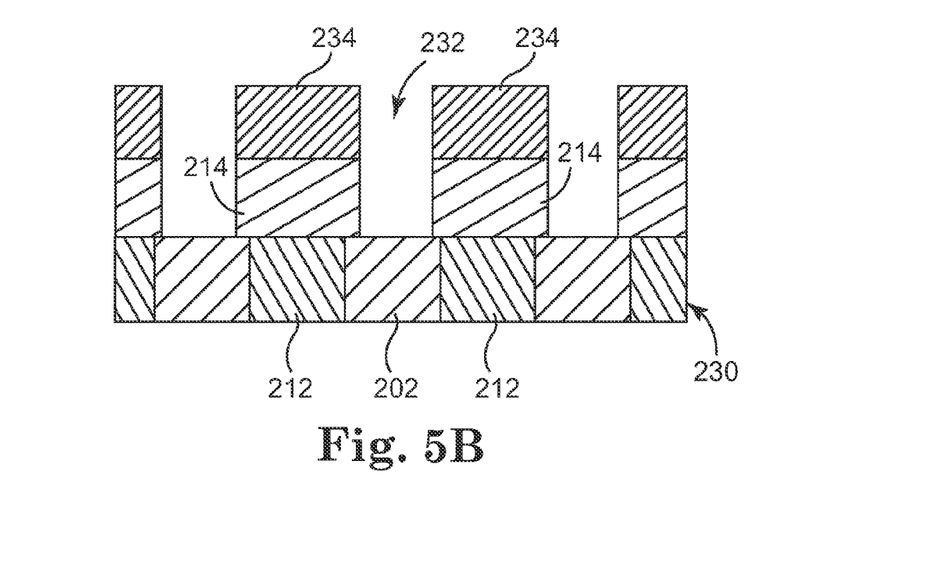
FIG. 5B illustrates a cross-sectional view of one embodiment of the preprocessed wafer, a first dielectric material, and a second dielectric material.

FIG. 5B illustrates a cross-sectional view of one embodiment of preprocessed wafer 230, a first dielectric material 214, and a second dielectric material 234. In this embodiment, a first dielectric material, such as SiN or another suitable dielectric material is deposited over preprocessed wafer 230 to provide a first dielectric material layer. The first dielectric material layer is deposited using CVD, HDP-CVD, ALD, MOCVD, PVD, JVD, or other suitable deposition technique.

A second dielectric material, such as $SiO_2$ or another suitable dielectric material is deposited over the first dielectric material layer to provide a second dielectric material layer. The second dielectric material layer is deposited using CVD, HDP-CVD, ALD, MOCVD, PVD, JVD, or other suitable deposition technique. Portions of the second dielectric material layer and underlying portions of the first dielectric material layer are then etched to provide opening 232 exposing at least a portion of electrode 202 and to provide first dielectric material 214 and second dielectric material 234. First dielectric material 214 acts as an etch stop layer in subsequent processing steps.

While the followings FIGS. 6-10 illustrate embodiments using first dielectric material 214a as previously described and illustrated with reference to FIG. 5A, the embodiments are also applicable if using first dielectric material 214 and second dielectric material 234 as previously described and illustrated with reference to FIG. 5B.

Figure 6:
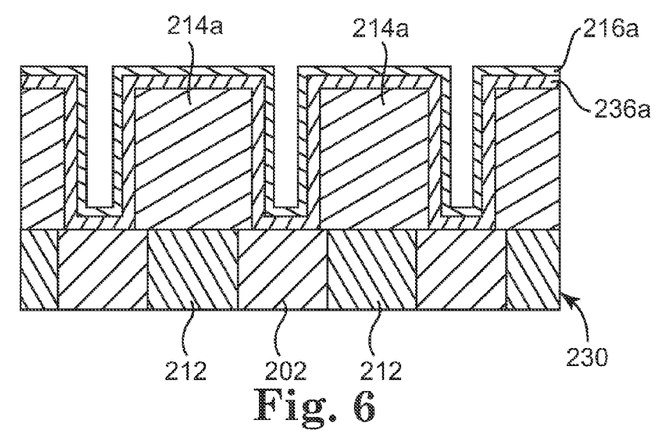
FIG. 6 illustrates a cross-sectional view of one embodiment of the preprocessed wafer, the first dielectric material, a heater (or phase change) material layer, and a second dielectric material layer.

FIG. 6 illustrates a cross-sectional view of one embodiment of preprocessed wafer 230, first dielectric material 214a, a heater (or phase change) material layer 236a, and a second dielectric material layer 216a. In one embodiment for fabricating memory cell 200a, 200c, or 200d previously described and illustrated with reference to FIGS. 3A, 3C, and 3D, respectively, a heater material, such as TiN, TaN, Ti, Ta, TiSiN, TaSiN, TiAlN, TaAlN, WN, or other suitable heater material is deposited over exposed portions of first dielectric material 214a and electrode 202 to provide heater material layer 236a. In another embodiment for fabricating memory cell 200b previously described and illustrated with reference to FIG. 3B, a phase change material, such as a chalcogenide compound material or other suitable phase change material is deposited over exposed portions of first dielectric material 214a and electrode 202 to provide phase change material layer 236a. Heater (or phase change) material layer 236a is deposited using CVD, HDP-CVD, ALD, MOCVD, PVD, JVD, or other suitable deposition technique.

A dielectric material, such as SiN, $Al_2O_3$, or other suitable dielectric material is deposited over heater (or phase change) material layer 236a to provide second dielectric material layer 216a. Second dielectric material layer 216a is deposited using CVD, HDP-CVD, ALD, MOCVD, PVD, JVD, or other suitable deposition technique.

Figure 7:
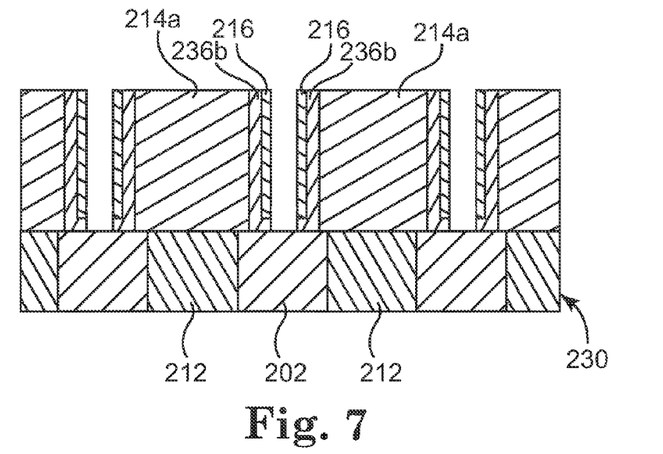
FIG. 7 illustrates a cross-sectional view of one embodiment of the preprocessed wafer, the first dielectric material, the heater (or phase change) material, and the second dielectric material.

FIG. 7 illustrates a cross-sectional view of one embodiment of preprocessed wafer 230, first dielectric material 214a, heater (or phase change) material 236b, and second dielectric material 216. Heater (or phase change) material layer 236a and second dielectric material layer 236a are spacer etched to expose the top of first dielectric material 214a and the top of electrode 202 to provide heater (or phase change) material 236b and second dielectric material 216.

Figure 8:
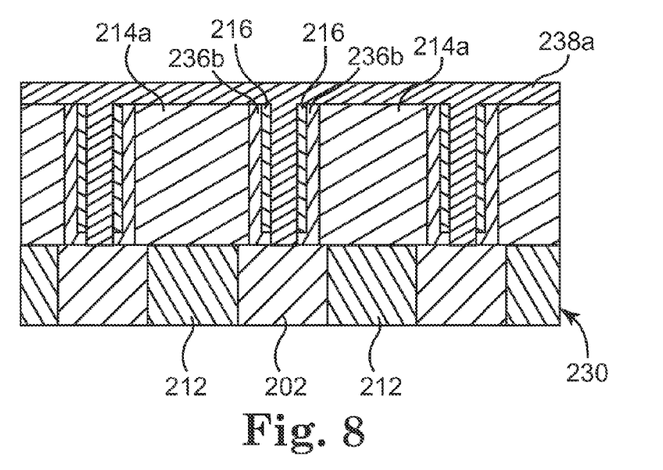
FIG. 8 illustrates a cross-sectional view of one embodiment of the preprocessed wafer, the first dielectric material, the heater (or phase change) material, the second dielectric material, and a phase change (or heater) material layer.

FIG. 8 illustrates a cross-sectional view of one embodiment of preprocessed wafer 230, first dielectric material 214a, heater (or phase change) material 236b, second dielectric material 216, and a phase change (or heater) material layer 238a. In one embodiment, where material 236b is heater material, a phase change material, such as a chalcogenide compound material or other suitable phase change material is deposited over exposed portions of first dielectric material 214a, heater material 236b, second dielectric material 216, and electrode 202 to provide phase change material layer

238a. In another embodiment, where material 236b is phase change material, a heater material, such as TiN, TaN, Ti, Ta, TiSiN, TaSiN, TiAlN, TaAlN, WN, or other suitable heater material is deposited over exposed portions of first dielectric material 214a, phase change material 236b, second dielectric material 216, and electrode 202 to provide heater material layer 238a. Phase change (or heater) material layer 238a is deposited using CVD, HDP-CVD, ALD, MOCVD, PVD, JVD, or other suitable deposition technique.

Figure 9:
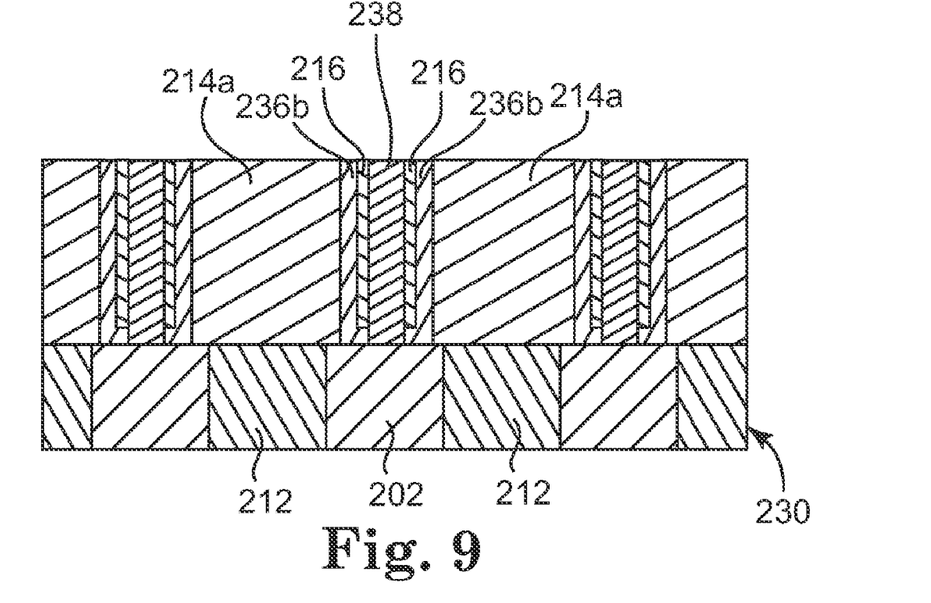
FIG. 9 illustrates a cross-sectional view of one embodiment of the preprocessed wafer, the first dielectric material, the heater (or phase change) material, the second dielectric material, and the phase change (or heater) material after planarization.

FIG. 9 illustrates a cross-sectional view of one embodiment of preprocessed wafer 230, first dielectric material 214a, heater (or phase change) material 236b, second dielectric material 216, and phase change (or heater) material 238 after planarization. Phase change (or heater) material layer 238a is planarized to expose first dielectric material 214a, heater (or phase change) material 236b, and second dielectric material 216 to provide phase change (or heater) material 238. Phase change (or heater) material layer 238a is planarized using chemical mechanical planarization (CMP) or another suitable planarization technique.

Figure 10:
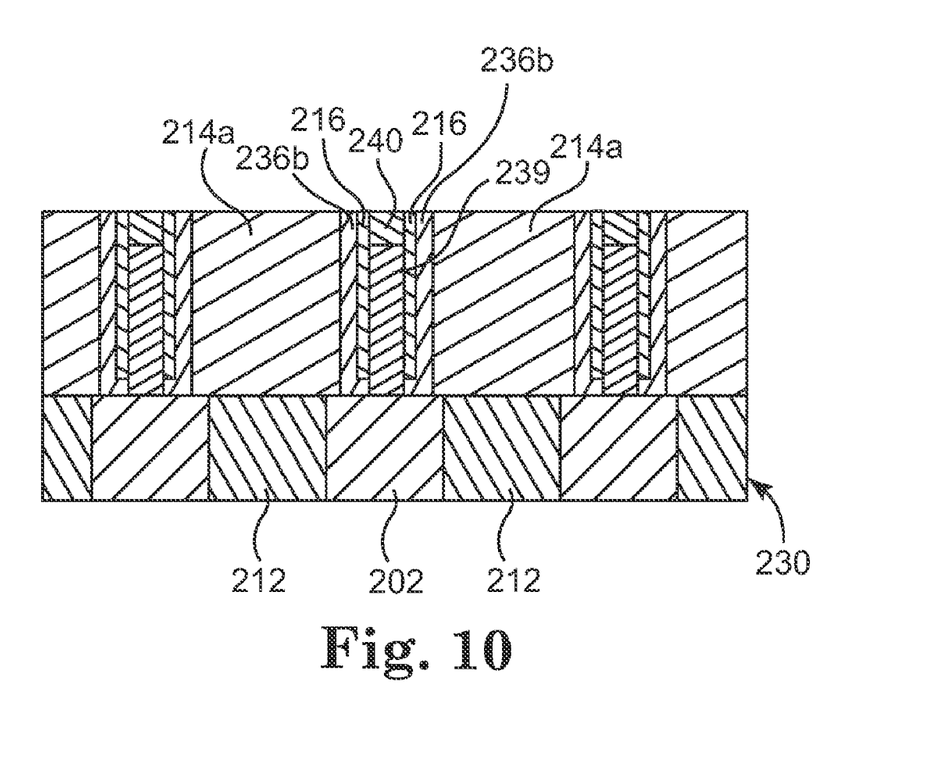
FIG. 10 illustrates a cross-sectional view of one embodiment of the preprocessed wafer, the first dielectric material, the heater (or phase change) material, the second dielectric material, the phase change (or heater) material, and a capping material.

FIG. 10 illustrates a cross-sectional view of one embodiment of preprocessed wafer 230, first dielectric material 214a, heater (or phase change) material 236b, second dielectric material 216, phase change (or heater) material 239, and a capping material 240. In this embodiment, phase change (or heater) material 238 is recess etched to provide phase change (or heater) material 239. In one embodiment, where the capping material is removed in subsequent processing steps, a dielectric material, such as SiN or another suitable dielectric material is deposited over exposed portions of first dielectric material 214a, heater (or phase change) material 236b, second dielectric material 216, and phase change (or heater) material 239 to provide a dielectric material layer. The dielectric material layer is deposited using CVD, HDP-CVD, ALD, MOCVD, PVD, JVD, or other suitable deposition technique. The dielectric material layer is then planarized to expose first dielectric material 214a, heater (or phase change) material 236b, and second dielectric material 216 to provide capping material 240. The dielectric material layer is planarized using CMP or another suitable planarization technique.

In another embodiment, where the capping material is removed or left in place in subsequent processing steps, an electrically conductive material, such as TiN, TaN, W, Al, Ti, Ta, TiSiN, TaSiN, TiAlN, TaAlN, WN, Cu, C, or other suitable electrically conductive material is deposited over exposed portions of first dielectric material 214a, heater (or phase change) material 236b, second dielectric material 216, and phase change (or heater) material 239 to provide an electrically conductive material layer. The electrically conductive material layer is deposited using CVD, HDP-CVD, ALD, MOCVD, PVD, JVD, or other suitable deposition technique. The electrically conductive material layer is then planarized to expose first dielectric material 214a, heater (or phase change) material 236b, and second dielectric material 216 to provide capping material 240. The electrically conductive material layer is planarized using CMP or another suitable planarization technique.

While the following FIGS. 11A-19B illustrate embodiments using phase change (or heater) material 238 as previously described and illustrated with reference to FIG. 9, the embodiments are also applicable if using phase change (or heater) material 239 and capping material 240 as previously described and illustrated with reference to FIG. 10.

Figure 11A:
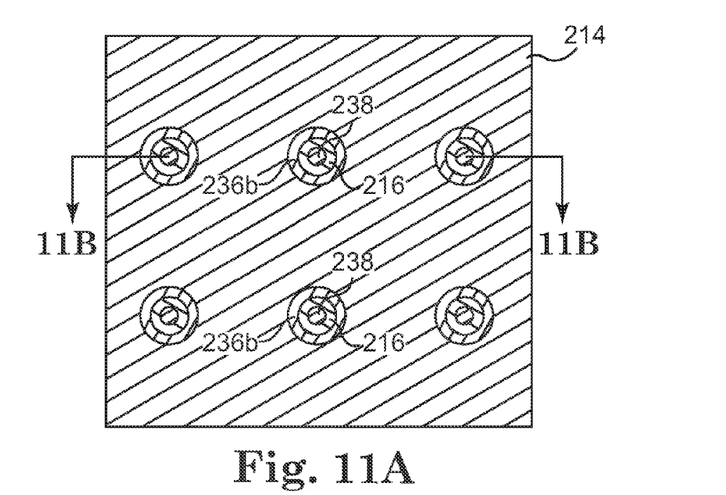
FIG. 11A illustrates a top view of one embodiment of the first dielectric material, the heater (or phase change) material, the second dielectric material, and the phase change (or heater) material after etching the first dielectric material.
Figure 11B:
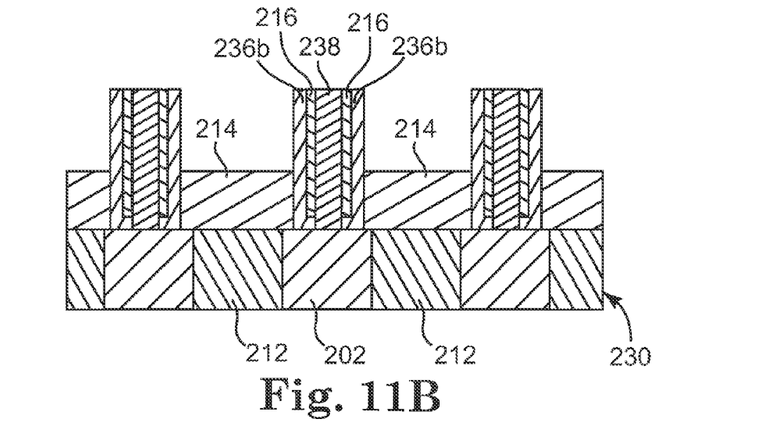
FIG. 11B illustrates a cross-sectional view of one embodiment of the preprocessed wafer, the first dielectric material, the heater (or phase change) material, the second dielectric material, and the phase change (or heater) material after etching the first dielectric material.

FIG. 11A illustrates a top view and FIG. 11B illustrates a cross-sectional view of one embodiment of preprocessed wafer 230, first dielectric material 214, heater (or phase change) material 236b, second dielectric material 216, and phase change (or heater) material 238 after etching first dielectric material 214a. Dielectric material 214a is recess etched to expose a portion of the sidewalls of heater (or phase change) material 236b and to provide first dielectric material 214. In another embodiment, where first dielectric material 214 and second dielectric material 234 are used as previously described and illustrated with reference to FIG. 5B, second dielectric material 234 is etched to expose first dielectric material 214.

Figure 12:
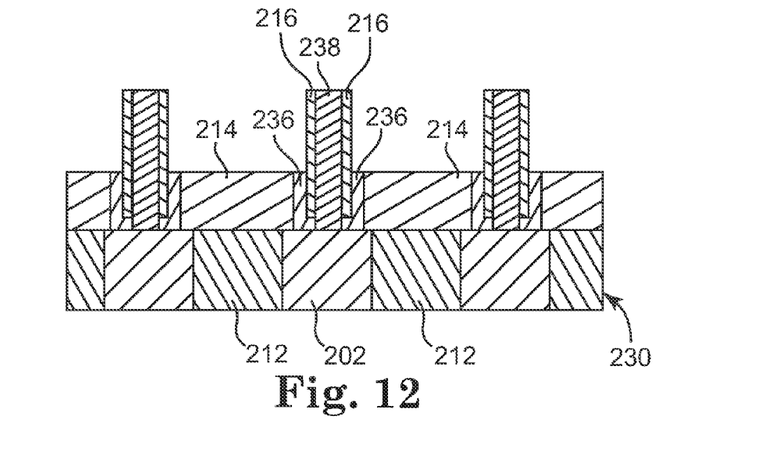
FIG. 12 illustrates a cross-sectional view of one embodiment of the preprocessed wafer, the first dielectric material, the heater (or phase change) material, the second dielectric material, and the phase change (or heater) material after etching the heater (or phase change) material.

FIG. 12 illustrates a cross-sectional view of one embodiment of preprocessed wafer 230, first dielectric material 214, heater (or phase change) material 236, second dielectric material 216, and the phase change (or heater) material 238 after etching heater (or phase change) material 236b. Heater (or phase change) material 236b is etched to expose a portion of the sidewalls of second dielectric material 216 and to provide heater (or phase change) material 236. In one embodiment heater (or phase change) material 236b is etched using an isotropic wet etch or another suitable etch.

Figure 13:
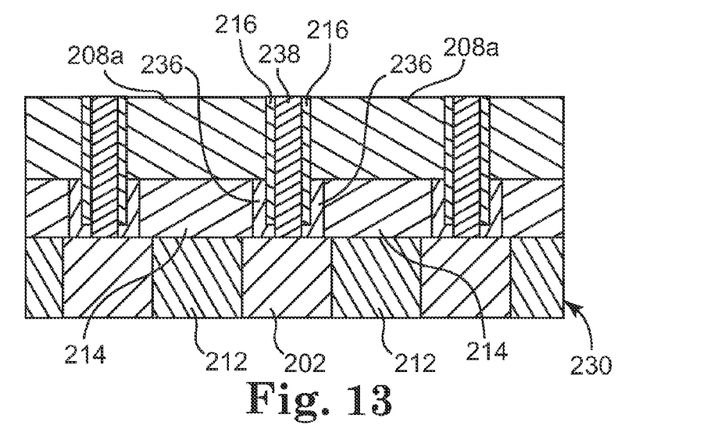
FIG. 13 illustrates a cross-sectional view of one embodiment of the preprocessed wafer, the first dielectric material, the heater (or phase change) material, the second dielectric material, the phase change (or heater) material, and a first bit line material layer.

FIG. 13 illustrates a cross-sectional view of one embodiment of preprocessed wafer 230, first dielectric material 214, heater (or phase change) material 236, second dielectric material 216, phase change (or heater) material 238, and a first bit line material layer 208a. A bit line material, such as W, Cu, Al, or other suitable bit line material is deposited over exposed portions of first dielectric material 214, heater (or phase change) material 236, second dielectric material 216, and phase change (or heater) material 238 to provide a bit line material layer. The bit line material layer is deposited using CVD, HDP-CVD, ALD, MOCVD, PVD, JVD, or other suitable deposition technique. The bit line material layer is then planarized to expose second dielectric material 216 and phase change (or heater) material 238 to provide first bit line material layer 208a. The bit line material layer is planarized using CMP or another suitable planarization technique.

Figure 14A:
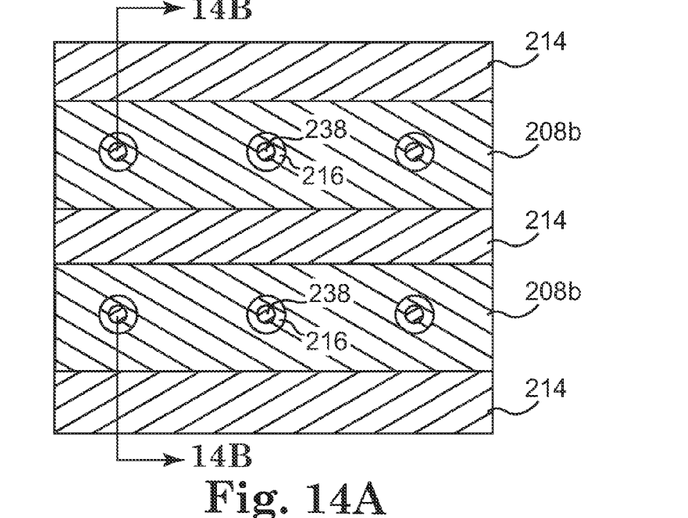
FIG. 14A illustrates a top view of one embodiment of the first dielectric material, the second dielectric material, the phase change (or heater) material, and lines of first bit line material after etching the first bit line material layer.
Figure 14B:
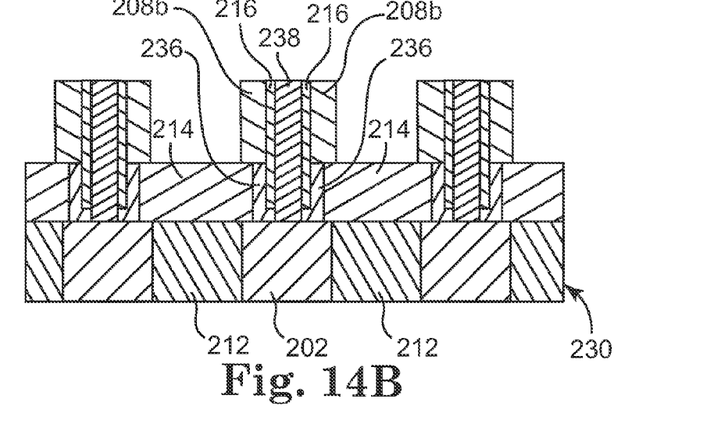
FIG. 14B illustrates a cross-sectional view of one embodiment of the preprocessed wafer, the first dielectric material, the heater (or phase change) material, the second dielectric material, the phase change (or heater) material, and lines of first bit line material after etching the first bit line material layer.

FIG. 14A illustrates a top view and FIG. 14B illustrates a cross-sectional view of one embodiment of preprocessed wafer 230, first dielectric material 214, heater (or phase change) material 236, second dielectric material 216, phase change (or heater) material 238, and lines of first bit line material 208b after etching first bit line material layer 208a. Portions of first bit line material layer 208a are etched to expose portions of first dielectric material 214 and to provide lines of first bit line material 208b. In one embodiment, line lithography is used to define lines of first bit line material 208b. Lines of first bit line material 208b contact the top of heater (or phase change) material 236.

Figure 15:
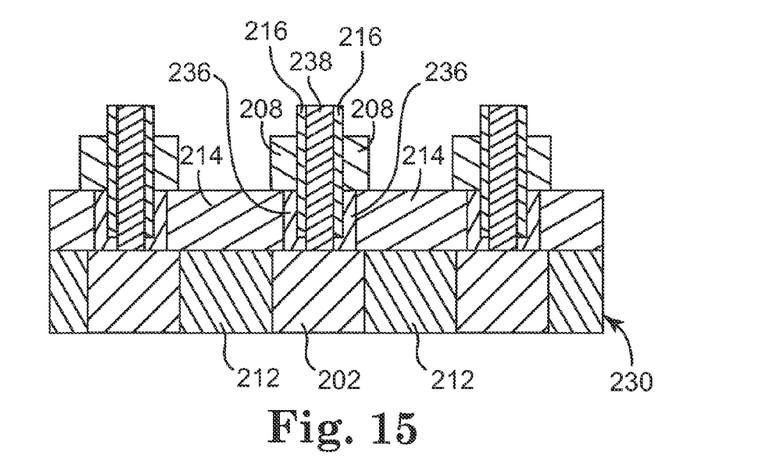
FIG. 15 illustrates a cross-sectional view of one embodiment of the preprocessed wafer, the first dielectric material, the heater (or phase change) material, the second dielectric material, the phase change (or heater) material, and first bit lines after etching the lines of first bit line material.

FIG. 15 illustrates a cross-sectional view of one embodiment of preprocessed wafer 230, first dielectric material 214, heater (or phase change) material 236, second dielectric material 216, phase change (or heater) material 238, and first bit lines 208 after etching lines of first bit line material 208b. Lines of first bit line material 208b are recess etched to expose portions of the sidewalls of dielectric material 216 and to provide first bit lines 208.

Figure 16:
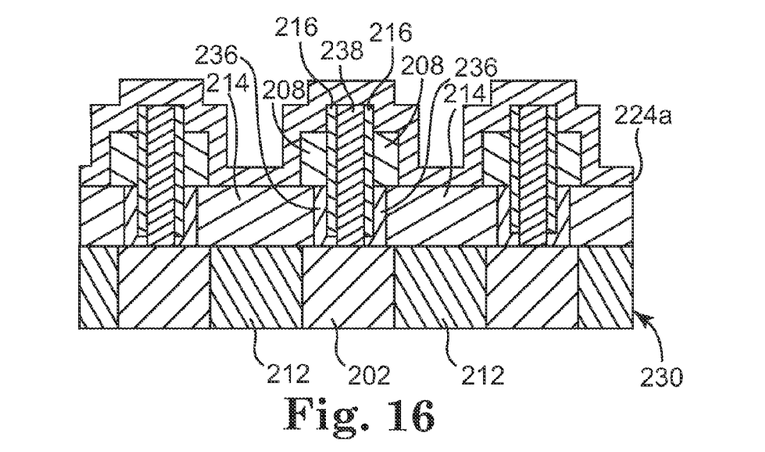
FIG. 16 illustrates a cross-sectional view of one embodiment of the preprocessed wafer, the first dielectric material, the heater (or phase change) material, the second dielectric material, the phase change (or heater) material, the first bit lines, and an encapsulation material layer.

FIG. 16 illustrates a cross-sectional view of one embodiment of preprocessed wafer 230, first dielectric material 214, heater (or phase change) material 236, second dielectric material 216, phase change (or heater) material 238, first bit lines 208, and an encapsulation material layer 224a. In one embodiment, an encapsulation material, such as SiN or another suitable dielectric material is deposited over exposed portions of first dielectric material 214, second dielectric material 216, phase change (or heater) material 238, and first bit lines 208 to provide encapsulation material layer 224a.

Encapsulation material layer 224a is deposited using CVD, HDP-CVD, ALD, MOCVD, PVD, JVD, or other suitable deposition technique.

Figure 17:
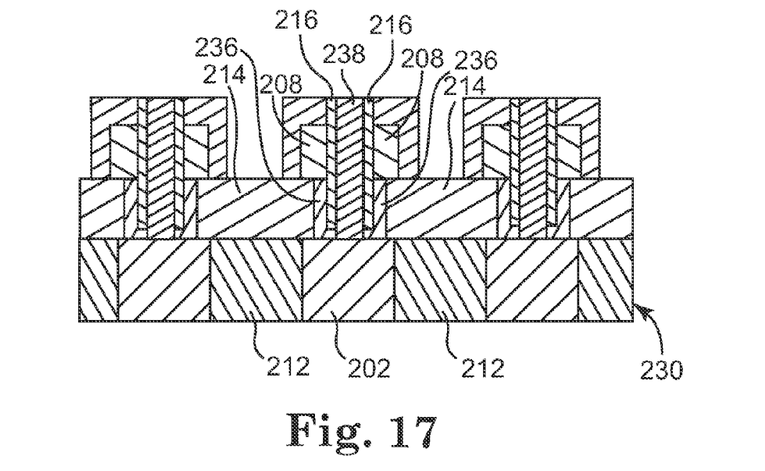
FIG. 17 illustrates a cross-sectional view of one embodiment of the preprocessed wafer, the first dielectric material, the heater (or phase change) material, the second dielectric material, the phase change (or heater) material, the first bit lines, and the encapsulation material after etching the encapsulation material layer.

FIG. 17 illustrates a cross-sectional view of one embodiment of preprocessed wafer 230, first dielectric material 214, heater (or phase change) material 236, second dielectric material 216, phase change (or heater) material 238, first bit lines 208, and encapsulation material 224 after etching encapsulation material layer 224a. Encapsulation material layer 224a is spacer etched to expose the top of second dielectric material 216 and phase change (or heater) material 238 to provide encapsulation material 224.

Figure 18:
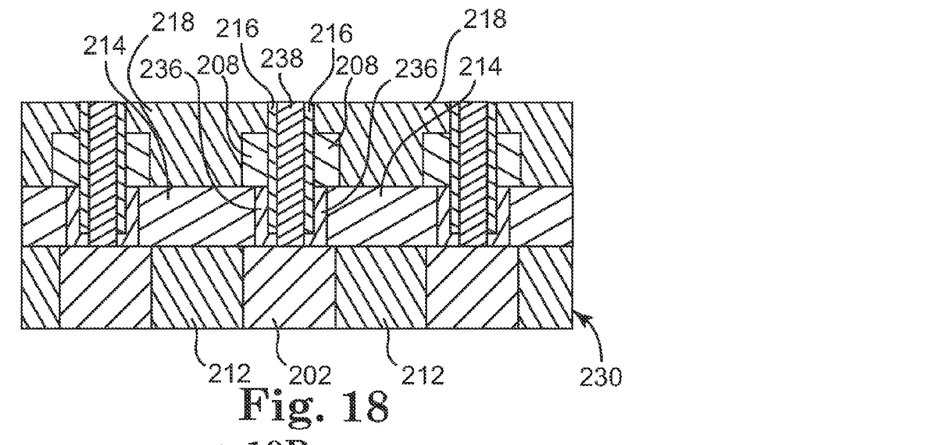
FIG. 18 illustrates a cross-sectional view of one embodiment of the preprocessed wafer, the first dielectric material, the heater (or phase change) material, the second dielectric material, the phase change (or heater) material, the first bit lines, and third dielectric material.
Figure 19A:
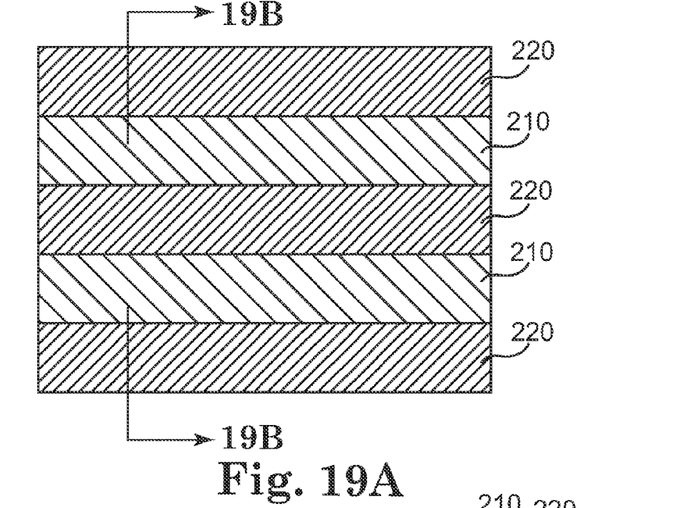
FIG. 19A illustrates a top view of one embodiment of second bit lines and fourth dielectric material.
Figure 19B:
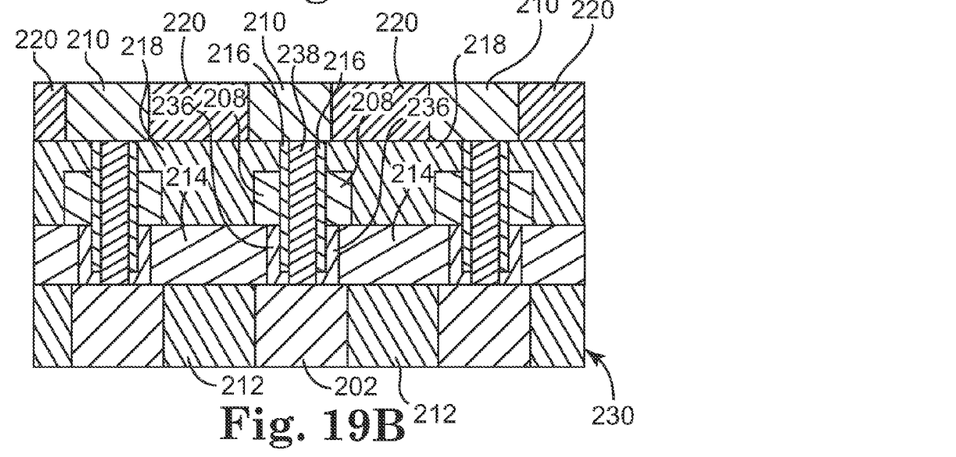
FIG. 19B illustrates a cross-sectional view of one embodiment of the preprocessed wafer, the first dielectric material, the heater (or phase change) material, the second dielectric material, the phase change (or heater) material, the first bit lines, the third dielectric material, second bit lines, and fourth dielectric material.

While the following FIGS. 18-19B illustrate embodiments without encapsulation material 224 following the process previously described and illustrated with reference to FIG. 15, the embodiments are also applicable when using encapsulation material 224 following the process previously described and illustrated with reference to FIG. 17.

FIG. 18 illustrates a cross-sectional view of one embodiment of preprocessed wafer 230, first dielectric material 214, heater (or phase change) material 236, second dielectric material 216, phase change (or heater) material 238, first bit lines 208, and third dielectric material 218. A dielectric material, such as $SiO_2$, $SiO_x$, SiN, SiON, $AlO_x$, FSG, BPSG, BSG, SiCN, SiCOH, or other suitable dielectric material is deposited over exposed portions of first dielectric material 214, second dielectric material 216, phase change (or heater) material 238, and first bit lines 208 to provide a dielectric material layer. The dielectric material layer is deposited using CVD, HDP-CVD, ALD, MOCVD, PVD, JVD, or other suitable deposition technique. The dielectric material layer is then planarized to expose the top of second dielectric material 216 and phase change (or heater) material 238 to provide third dielectric material 218. The dielectric material layer is planarized using CMP or another suitable planarization technique. In one embodiment, where capping material 240 is used as previously described and illustrated with reference to FIG. 10, the dielectric material layer, second dielectric material 216, and capping layer 240 are planarized to expose phase change (or heater) material 239 and to provide third dielectric material layer 218.

FIG. 19A illustrates a top view and FIG. 19B illustrates a cross-sectional view of one embodiment of preprocessed wafer 230, first dielectric material 214, heater (or phase change) material 236, second dielectric material 216, phase change (or heater) material 238, first bit lines 208, third dielectric material 218, second bit lines 210, and fourth dielectric material 220. In one embodiment, a bit line material, such as W, Cu, Al, or other suitable bit line material is deposited over exposed portions of second dielectric material 216, phase change (or heater) material 238, and third dielectric material 218 to provide a bit line material layer. The bit line material layer is deposited using CVD, HDP-CVD, ALD, MOCVD, PVD, JVD, or other suitable deposition technique. Portions of the bit line material layer are then etched to expose portions of third dielectric material 218 and to provide second bit lines 210. In one embodiment, second bit lines 210 are defined using line lithography.

A dielectric material, such as $SiO_2$, $SiO_x$, SiN, SiON, $AlO_x$, FSG, BPSG, BSG, SiCN, SiCOH, or other suitable dielectric material is deposited over exposed portions of third dielectric material 218 and second bit lines 210 to provide a dielectric material layer. The dielectric material layer is deposited using CVD, HDP-CVD, ALD, MOCVD, PVD, JVD, or other suitable deposition technique. The dielectric material layer is then planarized to expose the top of second bit lines 210 to provide fourth dielectric material 220. The dielectric material layer is planarized using CMP or another suitable planarization technique.

In another embodiment, a dielectric material, such as $SiO_2$, $SiO_x$, SiN, SiON, $AlO_x$, FSG, BPSG, BSG, SiCN, SiCOH, or other suitable dielectric material is deposited over exposed portions of second dielectric material 216, phase change (or heater) material 238, and third dielectric material 218 to provide a dielectric material layer. The dielectric material layer is deposited using CVD, HDP-CVD, ALD, MOCVD, PVD, JVD, or other suitable deposition technique. Portions of the dielectric material layer are then etched to expose the top of second dielectric material 216 and phase change (or heater) material 238 and to provide fourth dielectric material 220.

A bit line material, such as W, Cu, Al, or other suitable bit line material is deposited over exposed portions of second dielectric material 216, phase change (or heater) material 238, third dielectric material 218, and fourth dielectric material 220 to provide a bit line material layer. The bit line material layer is deposited using CVD, HDP-CVD, ALD, MOCVD, PVD, JVD, or other suitable deposition technique. The bit line material layer is then planarized to expose the top of fourth dielectric material 220 and to provide second bit lines 210. In one embodiment, where capping layer 240 is used as previously described and illustrated with reference to FIG. 10, the capping layer is removed prior to depositing the bit line material or the dielectric material.

Embodiments provide resistive memory cells including phase change elements programmed using a heater. The memory cells are accessed using a first bit line electrically coupled to a phase change element of each memory cell and a second bit line electrically coupled to a heater of each memory cell. In each memory cell, the heater is thermally coupled to the phase change element. The heater effectively heats phase change materials having low resistivity. In addition, since the programming signals are applied to the heater and not to the phase change element, there is no voltage threshold of the phase change element to overcome during programming. Further, since the heater is not in series with the phase change element, low resistance (set) states of the phase change element are easily sensed. The current density through each phase change element is also low and the temperature distribution in the phase change material is uniform, thereby improving the endurance of the phase change element.

While the specific embodiments described herein substantially focused on using phase change memory elements, the embodiments can be applied to any suitable type of resistance or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a first bit line;
   a resistance changing memory element coupled to the first bit line;
   a second bit line;
   a heater coupled to the second bit line; and
   an access device coupled to the resistance changing memory element and the heater.

2. The integrated circuit of claim 1, wherein the heater is configured for programming the resistance changing memory element.

3. The integrated circuit of claim 1, wherein the heater laterally surrounds at least a portion of the resistance changing memory element.

4. The integrated circuit of claim 1, wherein the resistance changing memory element laterally surrounds the heater.

5. The integrated circuit of claim 1, further comprising:
a dielectric material between the resistance changing memory element and the heater.

6. The integrated circuit of claim 1, wherein the resistance changing memory element is one of cylindrical-shaped and pipe-shaped.

7. The integrated circuit of claim 1, wherein the heater is one of cylindrical-shaped and pipe-shaped.

8. The integrated circuit of claim 1, wherein the resistance changing memory element comprises a phase change element.

9. A system comprising:
a host; and
a memory device communicatively coupled to the host; the memory device comprising:
a first bit line;
a phase change element coupled to the first bit line;
a second bit line;
a heater coupled to the second bit line; and
an access device coupled to the phase change element and the heater,
wherein the heater is configured for programming the phase change element.

10. The system of claim 9, wherein the access device comprises a transistor.

11. The system of claim 9, wherein the access device comprises a diode.

12. The system of claim 9, further comprising:
a word line coupled to the access device.

13. The system of claim 9, wherein the first bit line is parallel to the second bit line.

14. The system of claim 9, further comprising:
a write circuit coupled to the second bit line, the write circuit configured to program the phase change element;
a sense circuit coupled to the first bit line, the sense circuit configured to read the phase change element; and
a controller configured to control the write circuit and the sense circuit.

15. A method for fabricating an integrated circuit, the method comprising:
providing a preprocessed wafer including an electrode;
fabricating a resistance changing element coupled to the electrode;
fabricating a heater coupled to the electrode;
fabricating a first bit line coupled to the heater; and
fabricating a second bit line coupled to the resistance changing element.

16. The method of claim 15, wherein fabricating the resistance changing element comprises fabricating one of a cylindrical-shaped resistance changing element and a pipe-shaped resistance changing element.

17. The method of claim 15, wherein fabricating the heater comprises fabricating one of a cylindrical-shaped heater and a pipe-shaped heater.

18. The method of claim 15, further comprising:
fabricating a dielectric material spacer between the resistance changing element and the heater.

19. The method of claim 15, wherein fabricating the resistance changing element comprises fabricating a phase change element.

20. A method for fabricating an integrated circuit, the method comprising:
providing a preprocessed wafer including an electrode;
depositing first dielectric material over the preprocessed wafer;
etching the first dielectric material to provide an opening exposing at least a portion of the electrode;
forming heater material on sidewalls of the opening;
forming second dielectric material on sidewalls of the heater material;
depositing phase change material over the first electrode and contacting the sidewalls of the second dielectric material;
etching portions of the first dielectric material and the heater material to expose portions of the sidewalls of the second dielectric material;
forming a first bit line contacting the heater material and sidewalls of the second dielectric material; and
forming a second bit line contacting the phase change material.

21. The method of claim 20, further comprising:
recess etching a portion of the phase change material to provide a second opening; and
depositing a capping material in the second openings over the phase change material.

22. The method of claim 20, wherein depositing the first dielectric material comprises depositing a first layer and a second layer different from the first layer.

23. The method of claim 20, further comprising:
encapsulating the first bit line prior to forming the second bit line.

24. The method of claim 20, wherein forming the first bit line comprises:
depositing a bit line material over exposed portions of the first dielectric material, the heater material, the second dielectric material, and the phase change material;
etching the bit line material to provide a line of bit line material contacting the heater material; and
recess etching the line of bit line material to expose sidewalls of the second dielectric material to provide the first bit line.

25. The method of claim 20, wherein forming the second bit line comprises:
depositing a third dielectric material over exposed portions of the first dielectric material, the first bit line, the second dielectric material, and the phase change material;
planarizing the third dielectric material to expose the second dielectric material;
depositing a bit line material over exposed portions of the third dielectric material, the second dielectric material and the phase change material; and
etching the bit line material to provide the second bit line contacting the phase change material.

* * * * *